United States Patent [19]

Muramatsu et al.

[11] Patent Number: 4,477,485

[45] Date of Patent: Oct. 16, 1984

[54] PROCESS FOR FORMING AN ELECTRODE OF AN ORGANIC CELL

[75] Inventors: Hiromochi Muramatsu, Nagoya; Atsushi Watanabe, Toyokawa; Kunihiko Hara, Aichi, all of Japan

[73] Assignee: Nippondenso Co., Ltd., Kariya, Japan

[21] Appl. No.: 509,797

[22] Filed: Jun. 30, 1983

[30] Foreign Application Priority Data

Jul. 12, 1982 [JP] Japan ................................ 57-120770

[51] Int. Cl.³ .............................................. B05D 3/06
[52] U.S. Cl. .................................. 427/38; 204/192 N; 427/35; 427/124; 427/250; 427/256; 427/296
[58] Field of Search .................... 427/38, 35, 124, 250, 427/256, 296; 204/192 N

*Primary Examiner*—Bernard D. Pianalto
*Attorney, Agent, or Firm*—Cushman, Darby & Cushman

[57] ABSTRACT

An electrode for use in an organic cell is provided by forming a thin film of a metal such as aluminum on the sheet of an organic electroconductive material such as polyacetylene by, for example, a vacuum evaporation method, and then forming an atom-interdiffused layer at the interface between the sheet and the thin film by a recoil ion implantation method, thereby enhancing the current collecting efficiency of the electrode.

9 Claims, No Drawings

PROCESS FOR FORMING AN ELECTRODE OF AN ORGANIC CELL

BACKGROUND OF THE INVENTION

This invention relates to a process for forming an electrode of an organic secondary cell by using an organic electroconductive material. More particularly, this invention pertains to a method for improving the adhesion of a thin metal film onto the electrode surface to enhance the current collecting efficiency of an organic electrode.

By the term "organic cell" used herein is meant an electric cell using an organic substance, such as polyacetylene, as an electrode.

Current pick-up from an organic electrode has been done by contacting the electrode with a metal wire such as platinum wire and drawing a current from the contacted section. This method, however, is incapable of high-efficiency pick-up of current because of a high contact resistance at a small area of contact. In order to enlarge the contact area, it has been attempted to bond a metal foil to the surface of an organic electrode by heat fusion. This operation, however, requires heating at a high temperature and for a fairly long time, so that the organic material of the electrode tends to suffer from a thermal deterioration in this treatment, thus incurring a dilemma between such possible sacrifice of the electrode material and the desired improvement of bonding strength.

SUMMARY OF THE INVENTION

The object of this invention is to provide a process for forming an electrode for an organic cell, which process can eliminate the defects of the conventional methods and is featured by a novel bonding technique for providing a secure bond between the organic electroconductive material of the electrode and the metal used as a current pick-up means without causing any deleterious effect to said organic electroconductive material.

According to this invention, a thin film made of a metal is formed on the surface of at least a part on at least one side of a sheet-shaped electrode made of an organic electroconductive material at so low a temperature that there is no possibility of causing any thermal deterioration of said organic material, and then an atom-interdiffused layer is formed at the interface between said thin metal film and said electrode sheet by a recoil ion implantation method to thereby provide a secure adhesion of said thin metal film to the electrode sheet.

DETAILED DESCRIPTION OF PREFERRED EMBODIMENTS

The organic secondary cells using an organic electroconductive material as electrodes are already known and, therefore, no explanation on such cells per se will be necessary to make herein.

In this invention, various known substances such as polyacetylene, polyparaphenylene, polypyrrole and the like can be used as the organic electroconductive material which constitutes the electrode. As for the material of the thin metal film to be formed on the electrode, a well-electroconductive material such as aluminum, nickel or tin is recommended.

The organic material employed in this invention can be safely used at a temperature below 200° C., but it was found that if the heating time is short, such material remains safe from thermal deterioration by heating up to about 300° C. In this invention, therefore, a thin metal film is formed on said organic electroconductive material under such temperature condition.

Firstly, a thin metal film having a thickness of at least 20 Å is formed, by using the ordinary vacuum evaporation or printing techniques, on a part or whole of the surface of a sheet-formed organic electroconductive material having a thickness of ordinarily 100 microns or more. When such a film is to be formed partly on the organic electroconductive material surface, the obtained thin metal film may have a shape like a comb, meshes, dots or a reticulate pattern with dots connected by lines. A photoresist method generally employed for the production of printed circuits is best suited for obtaining a metal film of such shapes.

An electron beam method or a resistance heating method is usually used for vacuum evaporation in this invention. In the case of the electron beam method, an electrode made of an organic electroconductive material is placed in a vacuum system and then the system is evacuated to a degree of vacuum not lower than $10^{-5}$ Torr. Under this condition, a desired metal layer is deposited on said electrode at room temperature (25° C.) according to an ordinary electron beam method. This method does not involve use of any high temperature which could cause a deterioration of the electrode material.

In the printing method, an electrode is formed by using usually a silver paste by screen printing. More definitely, a silver paste is printed into a desired pattern by using a 100- to 300-mesh screen at room temperature and then heated at a temperature of 150° to 300° C. for a period of up to 30 minutes to form a metal film. Generally the printing method is capable of forming the thin metal films ranging in thickness from about 2 microns to about 100 microns, so that, in some cases, such printing method is preferred to the vacuum evaporation method which is subject to certain limitations on the film thickness obtainable.

Then the obtained thin metal film is subjected to recoil ion implantation for attaining a secure bond of said film to the organic material of the electrode. By this recoil ion implantation, an atom-interdiffused layer is formed at the interface between the thin metal film and the organic material. This diffusion layer not only provides a required bonding force but also has the effect of reducing the electric resistance.

The ions to be applied according to such recoil ion implantation method include $Xe^+$, $Kr^+$ and $Ar^+$ ions. Such ions, for example $Ar^+$ ions, are driven into the thin film of a metal such as aluminum, and by making use of the resultantly produced kinetic energy, the metal (Al) atoms are diffused into the organic electroconductive material. This implantation operation may be conducted at a degree of vacuum below $10^{-6}$ Torr and an acceleration voltage below 20 MeV, and the ion implantation density may be suitably changed to suit the occasion.

This invention will be described more particularly below by way of an embodiment thereof.

EXAMPLE

On a polyacetylene sheet electrode was formed an aluminum layer to a thickness of 10 KÅ to an electron beam method under a vacuum of $5 \times 10^{-5}$ Torr and at room temperature (25° C.). This layer was then subjected to ion implantation by Xe+ ions according to a recoil ion implantation method under the following conditions: vacuum of not more than $1\times10^{-6}$ Torr, acceleration voltage of 1.5 MeV, implantation density of $1\times10^{16}$ cm$^{-2}$ and room temperature (25° C.). The obtained diffusion layer had a thickness of 120 Å. As a result, a significant reduction of electric resistance was realized. That is, the initial specific conductivity of the electrode material, which was $2.5\times10^{2}\Omega^{-1}\cdot\text{cm}^{-1}$, has ultimately elevated to $1.1\times10^{3}\Omega^{-1}\cdot\text{cm}^{-1}$.

What is claimed is:

1. A process for forming an electrode of an organic electroconductive material for use in an organic cell, in which a thin film of a metal is formed on the surface of at least a part of at least one side of the organic electroconductive material in a sheet form at such a temperature that no thermal deterioration occurs in said organic material, and then an atom-interdiffused layer is formed at the interface between said thin film and said electrode by a recoil ion implantation method.

2. The process according to claim 1, wherein the organic electroconductive material is polyacetylene, polyparaphenylene or polypyrrole.

3. The process according to claim 1, wherein the metal forming the thin film is aluminum, nickel or tin.

4. The process according to claim 1, wherein the thin film is so configured that it will not cover the whole surface of said organic material electrode.

5. The process according to claim 4, wherein the thin metal film has a shape like a comb, meshes, dots or a reticulate pattern with dots connected by lines.

6. The process according to claim 1, wherein the thin metal film is formed by a vacuum evaporation or printing method.

7. The process according to claim 1, wherein the thin metal film is formed at a temperature below 200° C.

8. The process according to claim 1, wherein the thin metal film is formed on a polyacetylene sheet by an electron beam method under a vacuum of $5\times10^{-5}$ Torr at room temperature.

9. The process according to claim 1, wherein the recoil ion implantation is carried out by using Xe+ ions under the following conditions: vacuum of not more than $1\times10^{-6}$ Torr, acceleration voltage of 1.5 MeV, implantation density of $1\times10^{16}$ cm$^{-2}$ and room temperature.

* * * * *